United States Patent
Govindassamy et al.

(10) Patent No.: US 10,912,223 B2
(45) Date of Patent: Feb. 2, 2021

(54) ELECTRIC MODULE, ELECTRICAL SYSTEM COMPRISING SUCH AN ELECTRIC MODULE, AND CORRESPONDING PRODUCTION METHODS

(71) Applicant: Valeo Systemes de Controle Moteur, Cergy-Pontoise (FR)

(72) Inventors: Valery Govindassamy, Cergy (FR); Christian Schwartz, Chatou (FR); Roger Deniot, Poissy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 249 days.

(21) Appl. No.: 15/027,920

(22) PCT Filed: Oct. 9, 2014

(86) PCT No.: PCT/FR2014/052562
§ 371 (c)(1),
(2) Date: Apr. 7, 2016

(87) PCT Pub. No.: WO2015/052441
PCT Pub. Date: Apr. 16, 2015

(65) Prior Publication Data
US 2016/0255745 A1 Sep. 1, 2016

(30) Foreign Application Priority Data

Oct. 9, 2013 (FR) ...................................... 13 59774

(51) Int. Cl.
*H05K 7/20* (2006.01)
*H05K 13/00* (2006.01)
(Continued)

(52) U.S. Cl.
CPC ....... *H05K 7/20254* (2013.01); *H05K 1/0272* (2013.01); *H05K 5/065* (2013.01);
(Continued)

(58) Field of Classification Search
CPC .. H05K 7/20254; H05K 1/0272; H05K 5/065; H05K 7/1432; H05K 13/0023;
(Continued)

(56) References Cited

U.S. PATENT DOCUMENTS 5,353,001 A * 10/1994 Meinel ................ H01F 17/0006
29/602.1
2005/0083665 A1 4/2005 Nakashima et al.
(Continued)

FOREIGN PATENT DOCUMENTS

| EP | 2 023 473 A2 | 2/2009 |
|---|---|---|
| EP | 2 131 481 A1 | 12/2009 |
| JP | 2004-190547 A | 7/2004 |

OTHER PUBLICATIONS

International Search Report issued in PCT/FR2014/052562 dated Mar. 2, 2015 (3 pages).
(Continued)

*Primary Examiner* — James Wu
*Assistant Examiner* — Hung Q Dang
(74) *Attorney, Agent, or Firm* — Osha Bergman Watanabe & Burton LLP (57) ABSTRACT

The method for producing the electric module comprises: securing at least one first electrical component (108, 110) to a first plate (102); then assembling each first electrical component (108, 110) to an electrical connection bar (104) to which at least one second component (120) is already secured.

15 Claims, 4 Drawing Sheets

(51) Int. Cl.
*H05K 7/14* (2006.01)
*H05K 1/02* (2006.01)
*H05K 5/06* (2006.01)
*H05K 13/04* (2006.01)
*H02M 7/00* (2006.01)
*H05K 3/20* (2006.01)

(52) U.S. Cl.
CPC ........... *H05K 7/1432* (2013.01); *H05K 13/00* (2013.01); *H05K 13/046* (2013.01); *H02M 7/003* (2013.01); *H05K 1/0203* (2013.01); *H05K 3/202* (2013.01); *H05K 2201/10409* (2013.01)

(58) Field of Classification Search
CPC ............ H05K 13/046; Y10T 156/1089; Y10T 156/1092; Y10T 156/1093; B29C 66/91411; B29C 66/91921
See application file for complete search history.

(56) References Cited

U.S. PATENT DOCUMENTS

| | | |
|---|---|---|
| 2008/0079145 A1 | 4/2008 | Tschirbs et al. |
| 2009/0309684 A1 | 12/2009 | Tsai et al. |
| 2010/0014988 A1* | 1/2010 | Tsutsui ................... F04B 35/04 417/44.1 |
| 2012/0320645 A1 | 12/2012 | Fujino et al. |

OTHER PUBLICATIONS

Written Opinion of the International Searching Authority issued in PCT/FR2014/052562 dated Mar. 2, 2015 (6 pages).

* cited by examiner

ELECTRIC MODULE, ELECTRICAL SYSTEM COMPRISING SUCH AN ELECTRIC MODULE, AND CORRESPONDING PRODUCTION METHODS

TECHNICAL FIELD

The present invention relates, in particular, to the field of power control electronics using for example electrical components comprising ferromagnetic material.

TECHNOLOGICAL BACKGROUND

Electrical components containing ferromagnetic material are generally sensitive to mechanical and/or thermo-mechanical stresses. Thus, their mechanical support must be guaranteed as far as possible. Furthermore, these components may, in operation, increase rapidly in temperature, so that they need to be cooled as much as possible.

A known cooling technique consists in placing the component to be cooled flat against an aluminum plate.

This is for example what is described by the US patent application published under the number US 2008/0079145 A1. This document furthermore describes the use of a heat-conductive bonding compound.

This type of bonding compound indeed offers numerous advantages. However, it has the drawback of polymerizing at high temperature.

The current electrical connecting bars often incorporate not only electrical components containing ferromagnetic material, but furthermore electrical components including heat-sensitive components which cannot withstand the polymerization temperature of the bonding compound.

As a consequence, there exists a need for a method of production of an electric module allowing the fixing of two different types of electrical components.

SUMMARY OF THE INVENTION

A method for fabrication of an electric module, characterized in that it comprises:
  the fixing of at least one first electrical component to a first plate, then
  the assembly of each first electrical component to an electrical connecting bar to which at least one second electrical component is already fixed.

By virtue of the method provided, the second component or components do not risk being deteriorated by the fixing of the first component or components.

Optionally, the fixing of the first electrical component to the first plate comprises:
  the deposition of a bonding compound between the first electrical component and the first plate,
  the heating of the bonding compound, for example to a temperature of at least 125° C., preferably of at least 150° C., for polymerizing the bonding compound.

Optionally, the assembly of the first electrical component with the electrical connecting bar comprises the fixing of the first component to the electrical connecting bar. Thus, the electrical connecting bar, the first and second components and the first plate form a module which may be manipulated in such a manner as to be for example transported from one location to another.

Optionally, the assembly of the first electrical component with the electrical connecting bar comprises:
  the positioning of a first portion of the electrical connecting bar on the first component, opposite to the first plate, such that the first component ends up between the electrical connecting bar and the first plate,
  the fixing of the electrical connecting bar to the first plate by at least one second portion of the connecting bar, said second portion extending from the first portion to the first plate.

Optionally, the electrical connecting bar comprises a plastic coating around at least one electrical conductor. In particular, the electrical conductor or conductors are designed to provide the electrical power supply for the second component and/or for the first component.

Optionally, the second electrical component is fixed to the plastic coating, notably by overmolding of the plastic coating over the second component and/or by means of an attachment mechanism.

Optionally, said second portion of the electrical connecting bar is integral to the plastic coating.

Optionally, the first plate is designed to dissipate the heat generated by the first component or components during their operation.

A method is provided for production of an electrical system, comprising:
  the fabrication of an electric module according to a method according to the invention,
  the fixing of the first plate to a second plate designed to dissipate the heat from the electric module.

Optionally, a circulation channel for coolant liquid and an access opening into the channel are formed in the second plate, and the first plate is fixed to the second plate in such a manner as to cover the opening, in order for the coolant liquid to come into contact with the first plate.

Optionally, the first plate is equipped with projections designed to extend into the opening after the first plate has been fixed to the second plate.

An electric module is also provided characterized in that it comprises:
  a first plate,
  an electrical connecting bar,
  at least one first electrical component mounted onto the electrical connecting bar, each first electrical component being furthermore fixed to the first plate by a polymerized bonding compound, the bonding compound having a certain polymerization temperature,
  at least one second electrical component fixed to the electrical connecting bar, each second electrical component having a maximum normal operating temperature lower than the polymerization temperature of the bonding compound.

An electrical system is also provided characterized in that it comprises:
  an electric module according to the invention,
  a second plate to which the first plate is fixed, the second plate being designed to dissipate the heat from the electric module.

Optionally, the electrical system furthermore comprises:
  a housing enclosing the electric module, the second plate forming a part of the housing, notably a base of the housing.

Optionally, the electrical system furthermore comprises:
  at least a third electrical component fixed to the second plate independently of the electric module.

DESCRIPTION OF THE FIGURES

Various embodiments of the invention will now be described, solely by way of example, with reference to the following figures.

DETAILED DESCRIPTION

Figure 1:
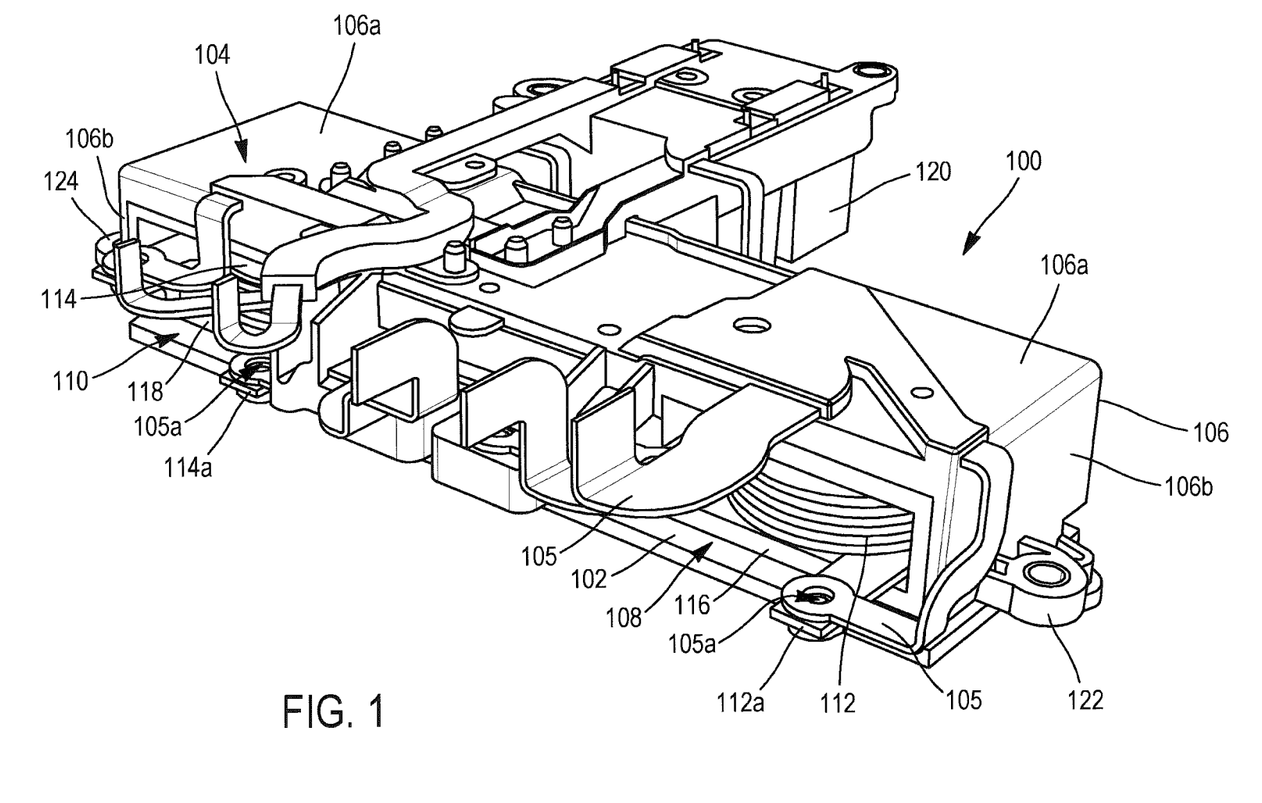
FIG. 1 shows, as a three-dimensional view, an electric module according to the invention.

With reference to FIG. 1, an electric module 100 implementing the invention will now be described.

The electric module 100 first of all comprises a plate 102 having, as will be explained in the following part, a function of substrate for electrical components and of heat dissipation for the heat generated by these electrical components. As will also be explained in the following part, the plate 102 is designed to be fixed onto another plate and will accordingly be referred to as an "intermediate plate". The intermediate plate 102 is preferably made of metal, for example of aluminum, and made preferably between one and fifteen millimeters in thickness.

The electric module 100 furthermore comprises an electrical connecting bar 104, generally referred to as a "bus bar". The electrical connecting bar 104 is designed to carry electricity, under a voltage preferably in the range between three hundred and five hundred volts and with an intensity preferably in the range between one and ten amps. The electrical connecting bar 104 comprises a plastic coating 106 around at least one electrical conductor 105, notably designed to supply electrical power to the components of the electric module 100.

The electric module 100 furthermore comprises two electrical components 108, 110. These components 108, 110 will henceforth be referred to as "fragile components" because they are sensitive to mechanical and/or thermo-mechanical stresses, and must accordingly be firmly fixed in order to guarantee their correct operation in the presence of vibrations or mechanical impacts. In the example described, the fragile components 108, 110 comprise at least a part made of a ferrite material, which is a "fragile" material in the sense previously described. Each of the two fragile components 108, 110 comprises a coil 112, 114 and a housing 116, 118. The fragile components 108, 110 will be described in more detail hereinbelow, with reference to FIG. 2. In order to be firmly held, the fragile components 108, 110 are fixed to the intermediate plate 102, on an upper face of the latter, by means of a polymerized bonding compound. This bonding compound has a polymerization temperature of at least 125° C., preferably of at least 150° C. The bonding compound is for example a silicone adhesive. The bonding compound furthermore preferably exhibits a high thermal conductivity, for example in the range between 1 and 6 W/m·K. The fixing of the fragile components 108, 110 to the intermediate plate 102 is implemented in an electrically insulated manner.

Figures 2, 3:
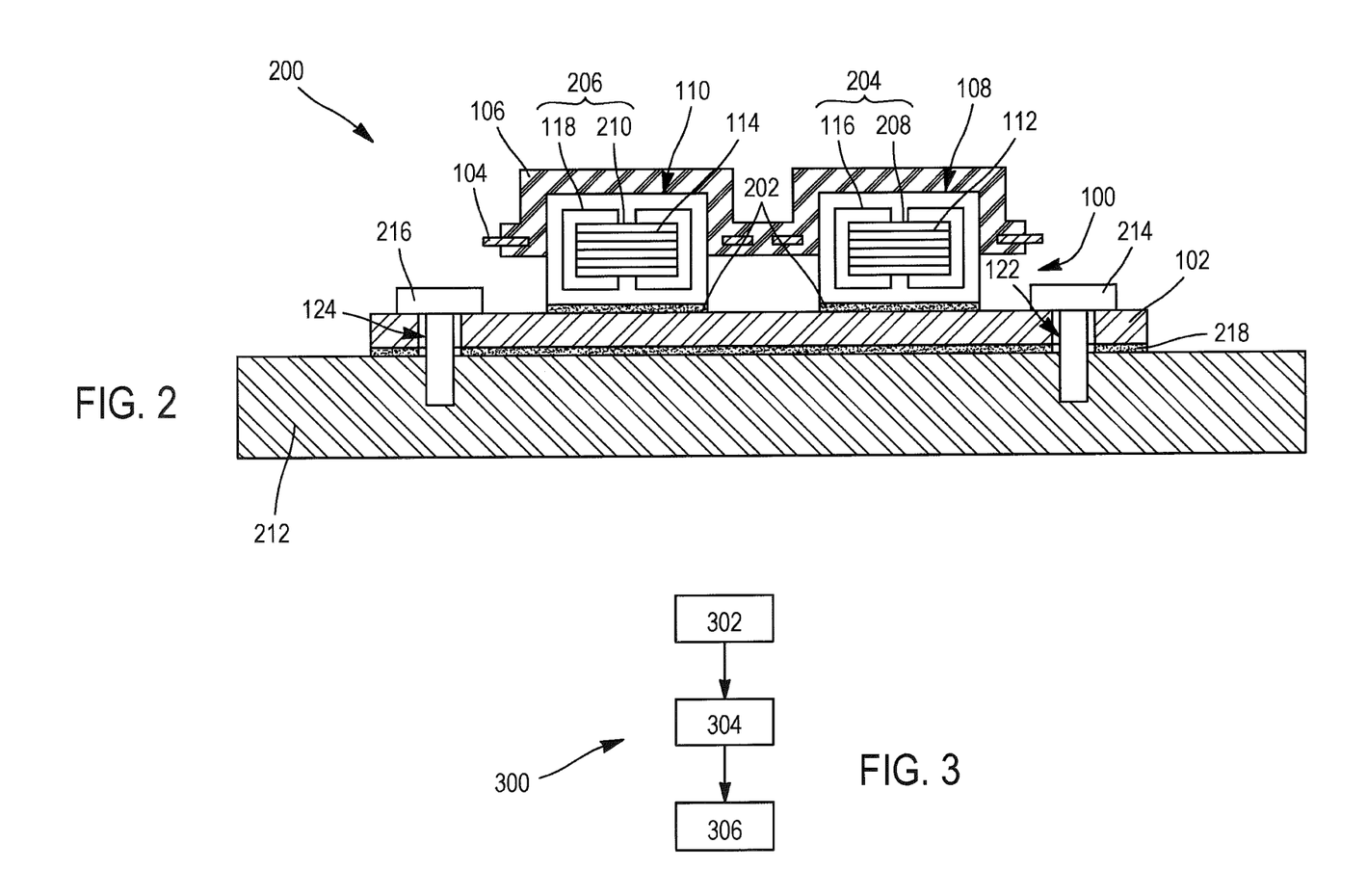
FIG. 2 shows, as a cross-sectional view, a first electrical system according to the invention, comprising the module in FIG. 1.
FIG. 3 shows, in the form of a block diagram, the steps of a method of production for the first electrical system in FIG. 2.

Furthermore, the fragile components 108, 110 are mounted onto the electrical connecting bar 104—in other words held in place with respect to the electrical connecting bar 104. More precisely, in the example described, a portion of the electrical connecting bar 104, called a covering portion 106a, is positioned over each fragile component 108, 110, opposite to the intermediate plate 102, in such a manner as to cover the fragile components 108, 110. Thus, the latter is clamped between the covering portion 106a of electrical connecting bar 104 and the intermediate plate 102. In order to keep the electrical connecting bar 104 in place, and, in this way, the fragile components 108, 110, the electrical connecting bar 104 furthermore has two vertical portions 106b extending from the covering portion 106a to the intermediate plate 102 and fixed to the latter. In the example described, the vertical portions 106b are portions of the coating 106 and are therefore integral to the latter. Furthermore, preferably, each vertical portion 106b comprises, at its end fixed to the intermediate plate 102, a pin (not shown) which is introduced into a corresponding opening of the intermediate plate 102, which allows the connecting bar 104 to be precisely positioned on the intermediate plate 102. In FIG. 2, one of the pins is positioned behind the perforation 122 visible in the foreground.

The fragile components 108, 110 may subsequently be electrically connected to the electrical conductor 105, for example by means of a screw passing through through-holes 105a of the conductor 105 and terminals 112a, 114a of the fragile components 108, 110.

The electric module 100 furthermore comprises at least one other electrical component 120. This electrical component 120 will henceforth be referred to as a "heat-sensitive component" because it has a maximum normal operating temperature lower than the polymerization temperature of the bonding compound. Normal operation is that allowing the electric module, and, as will be described hereinbelow, the electrical system comprising the electric module 100 to carry out their functions. For example, the maximum normal operating temperature is around 100° C. The heat-sensitive component 120 is fixed to the electrical connecting bar 104. The fixing may furthermore provide an electrical connection. The heat-sensitive component 120 is for example a thin-film capacitor, an electrolytic capacitor, a ceramic capacitor, a resistor, a component for measuring current or voltage, a core, or else a component of the MOSFET (which stands for metal-oxide-semiconductor field-effect transistor) type. Preferably, the heat-sensitive component 120 is fixed to the coating 106, notably by overmolding the coating 106 around this heat-sensitive component 120 and/or by means of a fixing mechanism.

The electric module 100 furthermore has perforations 122, 124 for the passage of screws formed, in the example in FIG. 1, in the plastic coating 106. As a variant, as illustrated in FIG. 2, these perforations could be formed in the intermediate plate 102.

With reference to FIG. 2, a first electrical system 200 will now be described. The first electrical system 200 is for example a voltage converter, such as notably a DC-DC converter or else an inverter.

The first electrical system 200 first of all comprises the electric module 100 in FIG. 1 (shown schematically in FIG. 2-in particular the vertical portions 106b are not shown). In this figure, the polymerized bonding compound is visible and denoted by the reference 202. Furthermore, it can be seen that each fragile component 108, 110 comprises a ferromagnetic core 204, 206 comprising an inner part 208, 210 around which the coil 112, 114 is wound, and an outer part surrounding the coil 112, 114 in such a manner as to form the housing 116, 118. The ferromagnetic core 204, 206 is for example made of ferrite.

The first electrical system 200 furthermore comprises another plate 212, henceforth referred to as 'main plate', to which the intermediate plate 102 is fixed by a lower face, opposite to the upper face of the intermediate plate 102. Preferably, the fixing is achieved mechanically, in other words by means of mechanical components, for example using screws 214, 216 in the perforations 122, 124, as opposed to a chemical attachment such as by bonding compound. The main plate 212 has a function of support for the intermediate plate 102 and of heat dissipation for the heat conveyed by this intermediate plate 102. For the heat conduction between the intermediate plate 102 and the main plate 212, a thermal grease 218 is preferably interposed between these two plates. In the example described, the main plate 212 is made of metal, for example of aluminum. It may be thicker than the intermediate plate 102.

As a variant, the main plate 212 is not made of metal but is an electronic board comprising for example an epoxy substrate. Thus, the main plate 212 is for example an FR4 (which stands for "Flame Resistant 4") or IMS (which stands for "Insulated Metal Substrates") plate.

It will be understood that the components of the electrical system 200, in particular the components 108, 110, 120 of the electric module 100, participate in the performance of the function of the electrical system 200, for example the function of voltage converter.

With reference to FIG. 3, a method for producing the first electrical system 200 will now be described.

During a step 302, each of the fragile components 108, 110 is fixed to the intermediate plate 102. For this purpose, the bonding compound 202 is deposited on the intermediate plate 102 and/or on each of the fragile components 108, 110 and the fragile components 108, 110 are held against the intermediate plate 102. The whole assembly is then put into an oven so as to be heated to a temperature at least equal to the polymerization temperature of the bonding compound 202, in order to polymerize the latter.

During a step 304, after the fixing of the fragile components 108, 110 to the intermediate plate 102, each of the fragile components 108, 110 is mounted onto the electrical connecting bar 104 to which each heat-sensitive component 120 is already fixed, for example by overmolding of the coating 106 or by screw attachment as has previously been described. Thus, the heat-sensitive component 120 is not put into the oven used in the step 302. The assembly comprises for example the positioning of the covering portion 106a of the connecting bar 104 over each fragile component 108, 110, opposite to the intermediate plate 102, then the fixing of the vertical portions 106b to the intermediate plate 102.

During a step 306, following the step 304, the intermediate plate 102 is fixed to the main plate 212. For this purpose, the thermal grease 218 is deposited on the main plate 212 and the intermediate plate 102 is posed onto the thermal grease 218. The screws 214, 216 are then screwed into the main plate 212, through the perforations 122, 124.

Figure 4:
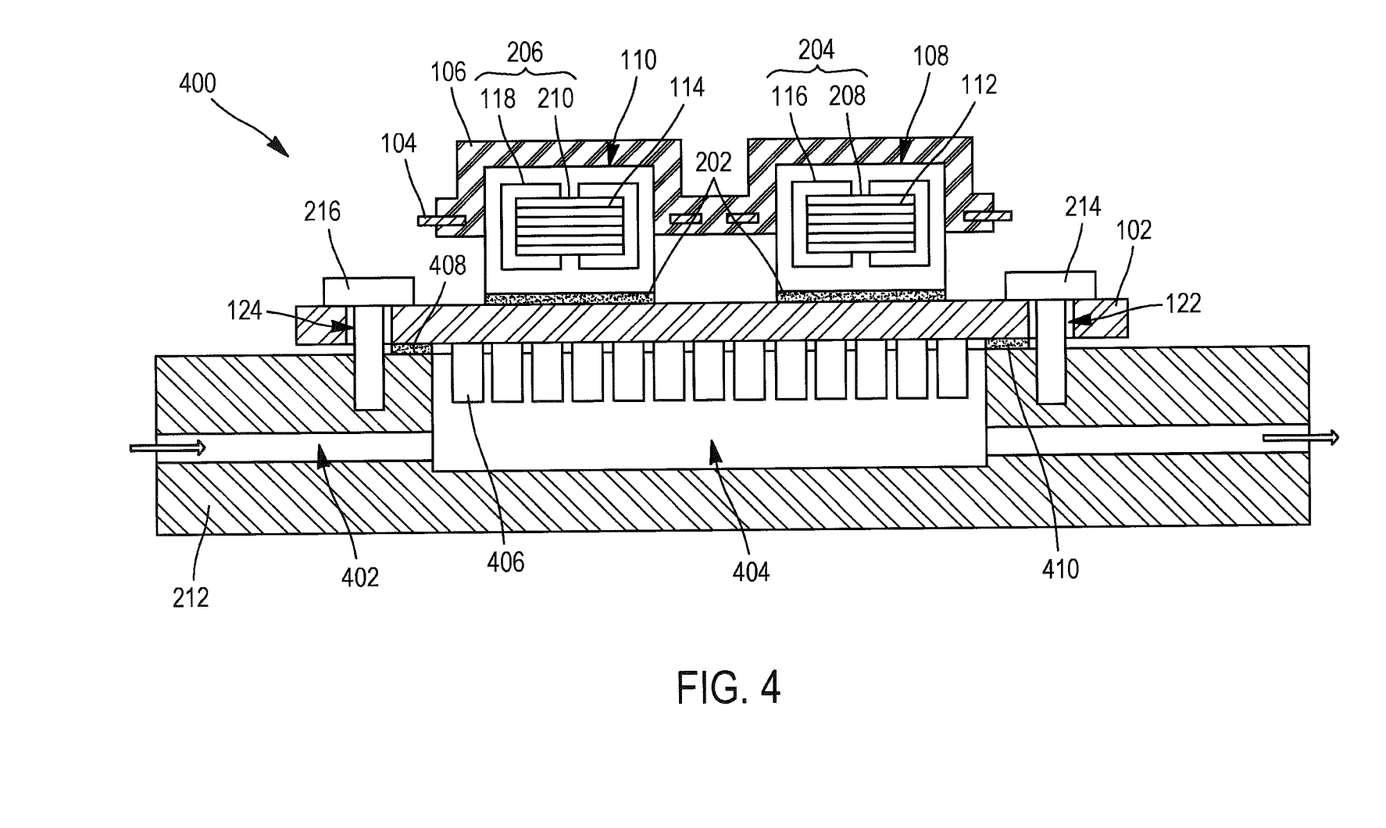
FIG. 4 shows, as a cross-sectional view, a second electrical system according to the invention, comprising the module in FIG. 1.

With reference to FIG. 4, a second electrical system 400 will now be described. The second electrical system 400 is for example a voltage converter, such as notably a DC-DC converter or else an inverter.

The second electrical system 400 is identical to the first electrical system 200, identical references denoting identical elements, except for the differences which will now be described.

A channel 402 for the circulation of liquid coolant is formed in the main plate 212, together with an access 404 opening into the channel 402.

The intermediate plate 102 is fixed to the main plate 212 in such a manner as to cover the opening 404 and is furthermore equipped with projections 406 extending into the opening 404 and designed to come into contact with the coolant liquid.

Furthermore, the thermal grease 218 may be replaced by leak-tight seals 408, 410 between the two plates 102, 212.

It will be understood that the components of the electrical system 400, in particular the components 108, 110, 120 of the electric module 100, participate in the implementation of the function of the electrical system 200, for example the inverter or DC-DC converter function.

The second electrical system 400 may be fabricated by means of the method 300, in which the thermal grease 218 may be replaced at least in part by the leak-tight seals 408, 410.

Figure 5:
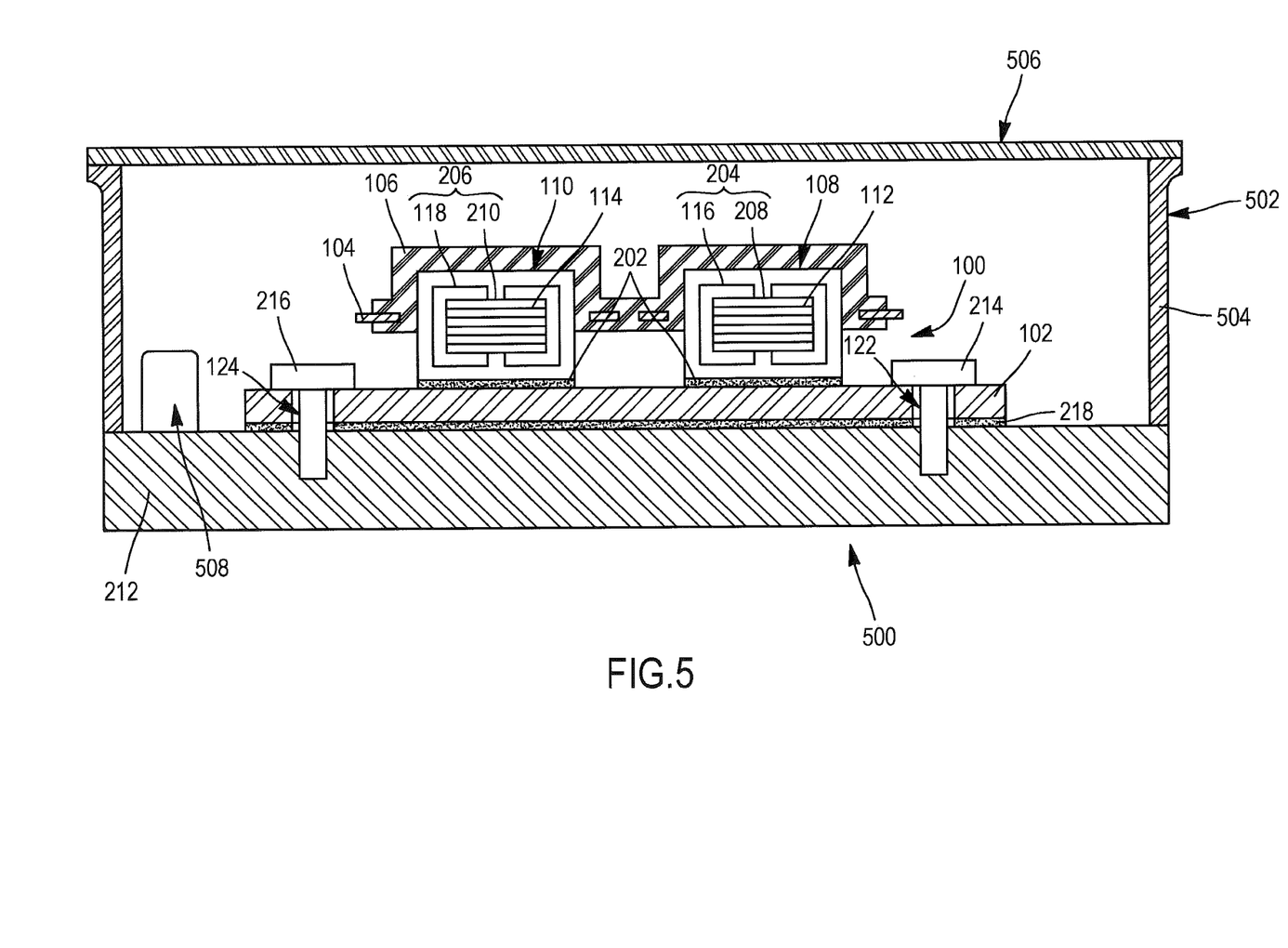
FIG. 5 shows, as a cross-sectional view, a third electrical system according to the invention, comprising the module in FIG. 1.

With reference to FIG. 5, a third electrical system 500 will now be described. The third electrical system 500 is for example a voltage converter, such as notably a DC-DC converter or else an inverter.

The third electrical system 500 is identical to the first electrical system 200, identical references denoting identical elements, except for the differences which will now be described.

The third electrical system 500 first of all comprises, in addition to elements already described, a housing 502 enclosing the electric module 100.

The housing 502 first of all comprises the main plate 212 which forms, in the example described, a base of the housing 502. The housing 502 furthermore comprises side walls 504 rising from the main plate 212. The housing 502 furthermore comprises a lid 506 designed to rest on the side walls 504.

The main plate 212 has an inner face, in other words oriented toward the interior of the housing 502, onto which the intermediate plate 102 of the electric module 100 is fixed.

The third electrical system 500 may furthermore comprise at least one other electrical component 508, henceforth referred to as "additional component". Rather than being fixed on the intermediate plate 102, each additional component 508 is for example fixed directly onto the main plate 212, notably on its inner face. Thus, the third component 508 is fixed to the main plate 212 independently of the electric module 100. Furthermore, the main plate 212 can dissipate the heat generated by the additional components. As a variant, the additional components 508 may be fixed on the side walls 504.

The third electrical system 500 furthermore preferably comprises a cooling system (for example similar to that in FIG. 4) of the main plate 212, which is preferably situated on an outer face of the main plate 212, opposite to the inner face.

It will be understood that the components of the electrical system 500, in particular the components 108, 110, 120 of the electric module 100 and the additional component or components 508, participate in the implementation of the function of the electrical system 200, for example the inverter or DC-DC converter function.

The third electrical system 500 may be fabricated by means of the method 300 to which may be added a step during which the electrical connecting bar 104 is electrically connected to the additional component(s) 508.

According to the preceding description, the invention relates to a method for fabricating an electric module 100, characterized in that it comprises:

the fixing of at least one first electrical component 108, 110 to a first plate 102, then the assembly of each first electrical component 108, 110 with an electrical connecting bar 104 to which at least one second electrical component 120 is already fixed.

Optionally, the first plate 102 is made of metal, and comprises for example aluminum or copper.

Optionally, each first electrical component 108, 110 comprises ferromagnetic material.

Optionally, at least one first electrical component 108, 110 comprises a coil 112, 114 wound around the ferromagnetic material.

Optionally, the bonding compound 202 is a silicone adhesive.

Optionally, the second component or components 120 comprise at least one of the following: a thin-film capacitor, an electrolytic capacitor, a ceramic capacitor, a resistance, a component for measuring current or voltage, a core and a component of the MOSFET type.

Optionally, each vertical portion 106b comprises, at its end fixed to the first plate 102, a pin which is introduced into a corresponding opening of the first plate 102, in particular for keeping the electrical connecting bar 104 engaged with the first plate 102. Thus, the electrical connecting bar 104, the first and second components 108, 110, 120 and the first plate 102 form a module which can be manipulated so as to be for example transported from one place to another.

Optionally, the fixing of the first plate 102 to the second plate 212 is implemented mechanically, for example by means of screws 214, 216.

Optionally, the third component 508 is furthermore electrically connected to the electrical connecting bar 104 of the electric module 100.

Optionally, the housing 502 furthermore encloses the third electrical component or components 508.

Optionally, the electric module 100 and the third electrical component or components 508 are fixed to the second plate 212 on the same face of the second plate 212.

Optionally, the electrical system 200, 400, 500 forms a voltage converter, for example an inverter or a DC-DC converter.

The invention furthermore relates to an electrical system characterized in that it comprises:

an electric module comprising:
a first plate 102,
an electrical connecting bar 104,
at least one first electrical component 108, 110 mounted onto the electrical connecting bar 104, each first electrical component 108, 110 being furthermore fixed to the first plate by a polymerized bonding compound 202, the bonding compound 202 having a certain polymerization temperature, the electrical system furthermore comprising a second plate 212 to which the first plate 102 is fixed, the second plate 212 being designed to dissipate the heat from the electric module 100.

In the electric module 100, the first component 108, 110 is fixed to the first plate 102. In particular, the size of the first plate 102 is just sufficient to receive the first component or components 108, 110. Thus, only the first plate 102 and the first component or components 108, 110 have been introduced into an oven in order to obtain a polymerization of the bonding compound 202. It was not necessary to introduce the whole assembly of the electrical system into the oven. The inertia in temperature rise was able to be limited and the bonding compound 202 polymerized more quickly. The production of the electrical system according to the invention is therefore simpler and faster than in the prior art. This electrical system may comprise any one of the features previously described with which it is compatible.

Furthermore, as is apparent from reading the preceding description, the invention allows the fixing of two different types of electrical components, in particular fragile components that need to be fixed by polymerization at high temperature, and heat-sensitive components which cannot withstand this high temperature.

Furthermore, since the polymerization of the bonding compound between the components and the intermediate plate is carried out prior to the fixing of the electrical connecting bar and of the heat-sensitive components, it is not necessary to introduce the electrical connecting bar and the heat-sensitive components into the oven. Thus, the latter can be relatively small. Furthermore, as fewer elements are in the oven, the duration of the heating is reasonable.

The present invention is not limited to the embodiments described hereinabove, but is on the contrary defined by the claims that follow. It will be apparent to those skilled in the art that modifications may be applied to the embodiments previously described.

For example, the intermediate and main plates could be fixed together before the electrical connecting bar is assembled with each fragile component.

Furthermore, the thermal grease is only one example. It plays the role of a thermal interface between the two plates. In its place, there could be air between the two plates. The grease may be replaced by any other thermal paste comprising heat-conductive charges (ceramic, alumina, silver charges) or pre-cutout cushion seals made of silicone, of epoxy, of polyurethane or of acrylic with the same types of charge.

Furthermore, the terms used in the claims should not be understood as being limited to the elements of the embodiments previously described, but should on the contrary be understood as covering all the equivalent elements that those skilled in the art may deduce from their general knowledge.

The invention claimed is:

1. A method for production of an electric module comprising:

a first step comprising:
fixing at least one first electrical component to a first plate by:
depositing a bonding compound between the at least one first electrical component and the first plate, the bonding compound having a polymerization temperature, and
heating the bonding compound to a temperature superior or equal to the polymerization temperature of the bonding compound, the bonding compound being polymerized after the bonding compound is deposited and heated, and after the first step, a second step comprising:
assembling the at least one first electrical component to an electrical connecting bar to which a second electrical component is already fixed,
wherein the second electrical component has a maximum normal operating temperature lower than the polymerization temperature of the bonding compound, and
wherein the assembly of the first electrical component with the electrical connecting bar comprises:
the positioning of a first portion of the electrical connecting bar on the first electrical component, opposite to the first plate, such that the first electrical component ends up between the electrical connecting bar and the first plate, and the fixing of the electrical connecting bar to the first plate by a second portion of the electrical connecting bar, said second portion extending from the first portion to the first plate.

2. The production method as claimed in claim 1, in which the assembly of the first electrical component with the electrical connecting bar comprises the fixing of the first electrical component to the electrical connecting bar.

3. The production method as claimed in claim 1, in which the electrical connecting bar comprises a plastic coating around at least one electrical conductor.

4. The production method as claimed in claim 1, in which said second portion of the electrical connecting bar is integral to a plastic coating.

5. The production method as claimed in claim 1, in which the first plate is designed to dissipate a heat generated by the first electrical component and/or a heat generated by the second electrical component during their operation.

6. A method for production of an electrical system, comprising:
fabricating the electric module according to the method as claimed in claim 1;
fixing the first plate to a second plate designed to dissipate a heat from the electric module,
wherein a channel for the circulation of coolant liquid and an access opening into the channel are formed in the second plate, and in which the first plate is fixed to the second plate in such a manner as to cover the opening, in order for the coolant liquid to come into contact with the first plate.

7. The method as claimed in claim 1, wherein the electrical connecting bar is embedded in a plastic coating, which is positioned over the first electrical component and on the opposite side with respect to the first plate.

8. The production method as claimed in claim 3, in which the second electrical component is fixed to the plastic coating, by overmolding of the plastic coating over the second electrical component and/or by means of a fixing mechanism.

9. The production method as claimed in claim 6, in which the first plate is equipped with projections designed to extend into the opening after the first plate has been fixed to the second plate.

10. An electric module, comprising:
a first plate;
an electrical connecting bar;
a first electrical component mounted onto the electrical connecting bar, the first electrical component being furthermore fixed to the first plate by a polymerized bonding compound, the bonding compound having a certain polymerization temperature; and
a second electrical component fixed to the electrical connecting bar, the second electrical component having a maximum normal operating temperature lower than the polymerization temperature of the bonding compound, and wherein an assembly of the first electrical component with the electrical connecting bar comprises:
a first portion of the electrical connecting bar positioned on the first electrical component, opposite to the first plate, such that the first electrical component ends up between the electrical connecting bar and the first plate,
a second portion of the electrical connecting bar that fixes the electrical connecting bar to the first plate, said second portion extending from the first portion to the first plate.

11. An electrical system, comprising:
the electric module as claimed in claim 10; and
a second plate to which the first plate is fixed, the second plate being configured to dissipate a heat from the electric module.

12. The electric module as claimed in claim 10, wherein the electrical connecting bar is embedded in a plastic coating, which is positioned over the first electrical component and on the opposite side with respect to the first plate.

13. The electrical system as claimed in claim 11, further comprising a housing enclosing the electric module, the second plate forming a base of the housing.

14. The electrical system as claimed in claim 11, further comprising at least a third electrical component fixed to the second plate independently of the electric module.

15. A method for production of an electric system, comprising:
fabricating an electric module using a method for production of the electric module comprising:
a first step comprising:
fixing at least one first electrical component to a first plate by:
depositing a bonding compound between the at least one first electrical component and the first plate, the bonding compound having a polymerization temperature, and
heating the bonding compound to a temperature superior or equal to the polymerization temperature of the bonding compound, the bonding compound being polymerized after the bonding compound is deposited and heated, and
a second step comprising assembling the at least one first electrical component to an electrical connecting bar to which a second electrical component is already fixed; and
fixing the first plate to a second plate designed to dissipate a heat from the electric module,
wherein the second electrical component has a maximum normal operating temperature lower than the polymerization temperature of the bonding compound, and
wherein a channel for the circulation of coolant liquid and an access opening into the channel are formed in the second plate, and in which the first plate is fixed to the second plate in such a manner as to cover the opening, in order for the coolant liquid to come into contact with the first plate.

* * * * *